(12) United States Patent
Lin et al.

(10) Patent No.: US 11,665,913 B2
(45) Date of Patent: May 30, 2023

(54) RESISTIVE RANDOM ACCESS MEMORY STRUCTURE AND FABRICATING METHOD OF THE SAME

(71) Applicant: UNITED MICROELECTRONICS CORP., Hsin-Chu (TW)

(72) Inventors: Yi-Yu Lin, Taichung (TW); Po-Kai Hsu, Tainan (TW); Chung-Yi Chiu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/541,226

(22) Filed: Dec. 2, 2021

(65) Prior Publication Data
US 2023/0136441 A1 May 4, 2023

(30) Foreign Application Priority Data
Nov. 2, 2021 (CN) .......................... 202111287182.1

(51) Int. Cl.
*H10B 63/00* (2023.01)
(52) U.S. Cl.
CPC .......... *H10B 63/30* (2023.02); *H10N 70/041* (2023.02); *H10N 70/066* (2023.02); *H10N 70/24* (2023.02); *H10N 70/826* (2023.02)

(58) Field of Classification Search
CPC ..................................................... H10B 63/00
See application file for complete search history.

(56) References Cited

U.S. PATENT DOCUMENTS

| | | | |
|---|---|---|---|
| 2012/0146223 A1 | 6/2012 | Zhao | |
| 2014/0104928 A1* | 4/2014 | Sutardja | H10N 70/8418 365/148 |
| 2014/0322885 A1 | 10/2014 | Xie | |
| 2016/0365512 A1 | 12/2016 | Sung | |

FOREIGN PATENT DOCUMENTS

| | | | | |
|---|---|---|---|---|
| CN | 103730571 A | * | 4/2014 | ......... G11C 13/0007 |
| WO | WO-2018004588 A1 | * | 1/2018 | |

* cited by examiner

*Primary Examiner* — Marvin Payen
(74) *Attorney, Agent, or Firm* — Winston Hsu

(57) ABSTRACT

A resistive random access memory (RRAM) structure includes a substrate. A transistor is disposed on the substrate. The transistor includes a gate structure, a source and a drain. A drain contact plug contacts the drain. A metal interlayer dielectric layer is disposed on the drain contact plug. An RRAM is disposed on the drain and within a first trench in the metal interlayer dielectric layer. The RRAM includes the drain contact plug, a metal oxide layer and a top electrode. The drain contact plug serves as a bottom electrode of the RRAM. The metal oxide layer contacts the drain contact plug. The top electrode contacts the metal oxide layer and a metal layer is disposed within the first trench.

12 Claims, 10 Drawing Sheets

RESISTIVE RANDOM ACCESS MEMORY STRUCTURE AND FABRICATING METHOD OF THE SAME

BACKGROUND OF THE INVENTION

1. Field of the Invention

The present invention relates to a variable resistance memory (RRAM) structure and a fabricating method of the same, and more particularly to a structure where the RRAM structure is arranged in the first metal layer (metal one level) of the local interconnection in the back end of line.

2. Description of the Prior Art

RRAM is a type of non-volatile memory that has the advantages of small memory cell size, ultra-high-speed operation, low-power operation, high endurance, and compatibility with CMOS.

The main operating principle of RRAM is to change the resistance of the metal oxide by applying bias voltage so as to store data. The data stored in RRAM is read by detecting different resistances in each of RRAMs.

Traditionally, RRAM is inserted in the position of the via one of the local interconnection in the back-end process. However, by doing so, the top surface of the via one which has RRAM inserted therein becomes uneven, and shifts from the original design position. Therefore, it is necessary to use an additional planarization process to smooth the top surface of RRAM to keep the top surface of the via one at the original design position.

SUMMARY OF THE INVENTION

In light of the above, the present invention provides a new method of manufacturing an RRAM structure, which prevents the RRAM from affecting the original horizontal position of the local interconnection without using any additional planarization process.

According to a preferred embodiment of the present invention, an RRAM structure includes a substrate. A transistor is disposed on the substrate, wherein the transistor includes a gate structure, a source and a drain. A drain contact plug contacts the drain. A metal interlayer dielectric layer is disposed on the drain contact plug. An RRAM is disposed on the drain and the RRAM is within a first trench within the metal interlayer dielectric layer, wherein the RRAM includes the drain contact plug, a metal oxide layer and a top electrode. The drain contact plug serves as a bottom electrode of the RRAM, the metal oxide layer contacts the drain contact plug and the top electrode contacts the metal oxide layer. A metal layer is disposed within the first trench.

A fabricating method of a resistive random access memory structure includes providing a substrate, wherein a first transistor is disposed on the substrate, the first transistor includes a first gate structure, a first source and a first drain, a first drain contact plug contacts the first drain, an interlayer dielectric layer covers the substrate and the first transistor. Next, a metal interlayer dielectric layer is formed to cover the interlayer dielectric layer. Later, a first patterning process is performed to etch the metal interlayer dielectric layer to form a first trench. The first drain contact plug is exposed through the first trench. Subsequently, a metal oxide material layer and a top electrode material layer are formed in sequence to fill in the first trench and cover the metal interlayer dielectric layer. A second patterning process is performed to pattern the metal oxide material layer and the top electrode material layer to form a metal oxide layer and a top electrode, wherein the top electrode, the metal oxide layer and the first drain contact plug form an RRAM. After that, a metal layer is formed to fill in the first trench and cover the metal interlayer dielectric layer and the RRAM. Finally, a planarization process is performed to remove the metal oxide layer, the top electrode and the metal layer outside of the first trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 depict a fabricating method of a resistive random access memory structure according to a preferred embodiment of the present invention, wherein:

FIG. 1 depicts a substrate with two transistors thereon;
FIG. 2 continues from FIG. 1;
FIG. 3 continues from FIG. 2;
FIG. 4 continues from FIG. 3;
FIG. 5 depicts a top view of FIG. 4;
FIG. 6 continues from FIG. 4;
FIG. 7 depicts a top view of FIG. 6;
FIG. 8 continues from FIG. 6;
FIG. 9 continues from FIG. 8.

DETAILED DESCRIPTION

Figure 2:
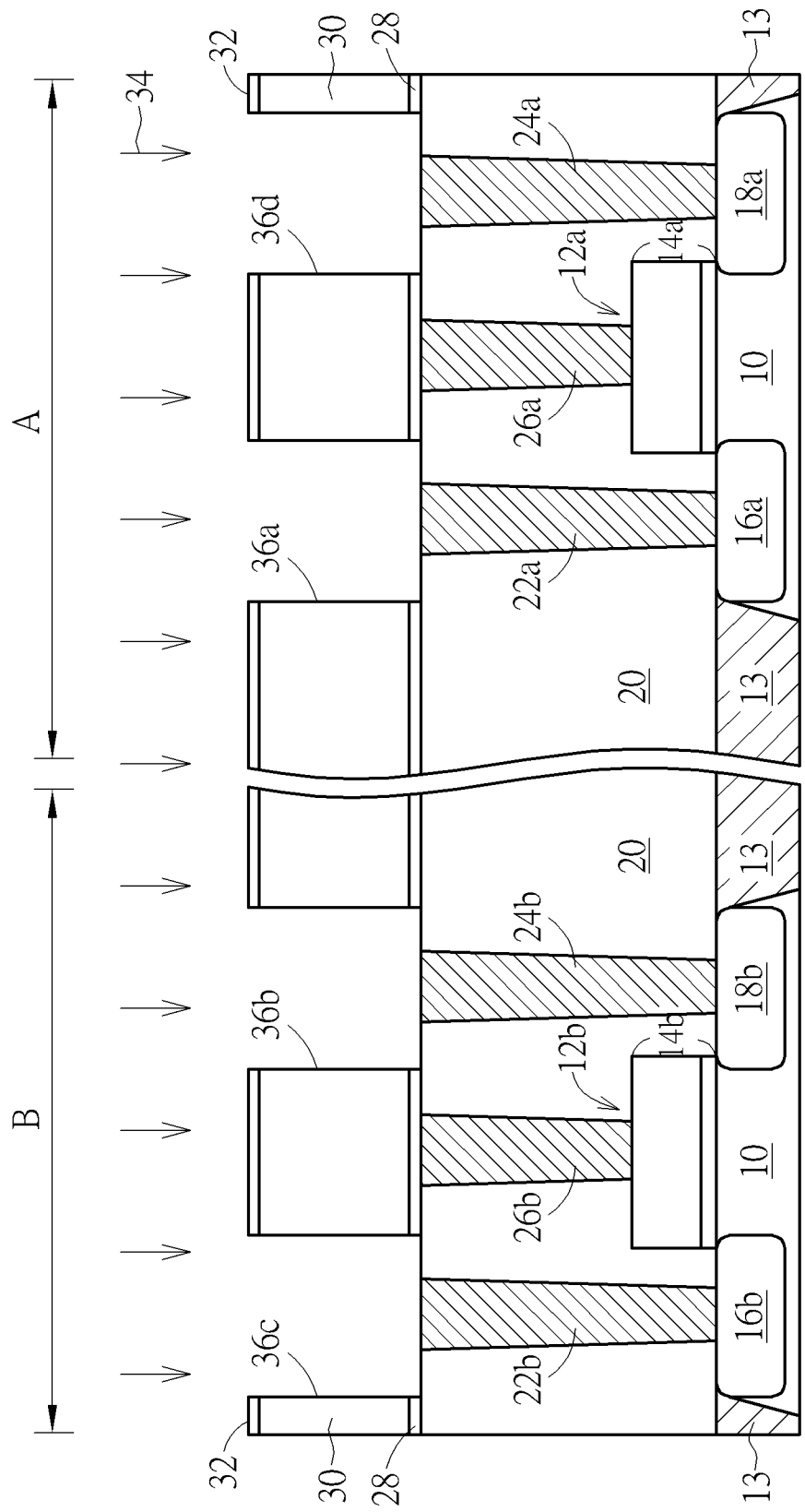
Figure 3:
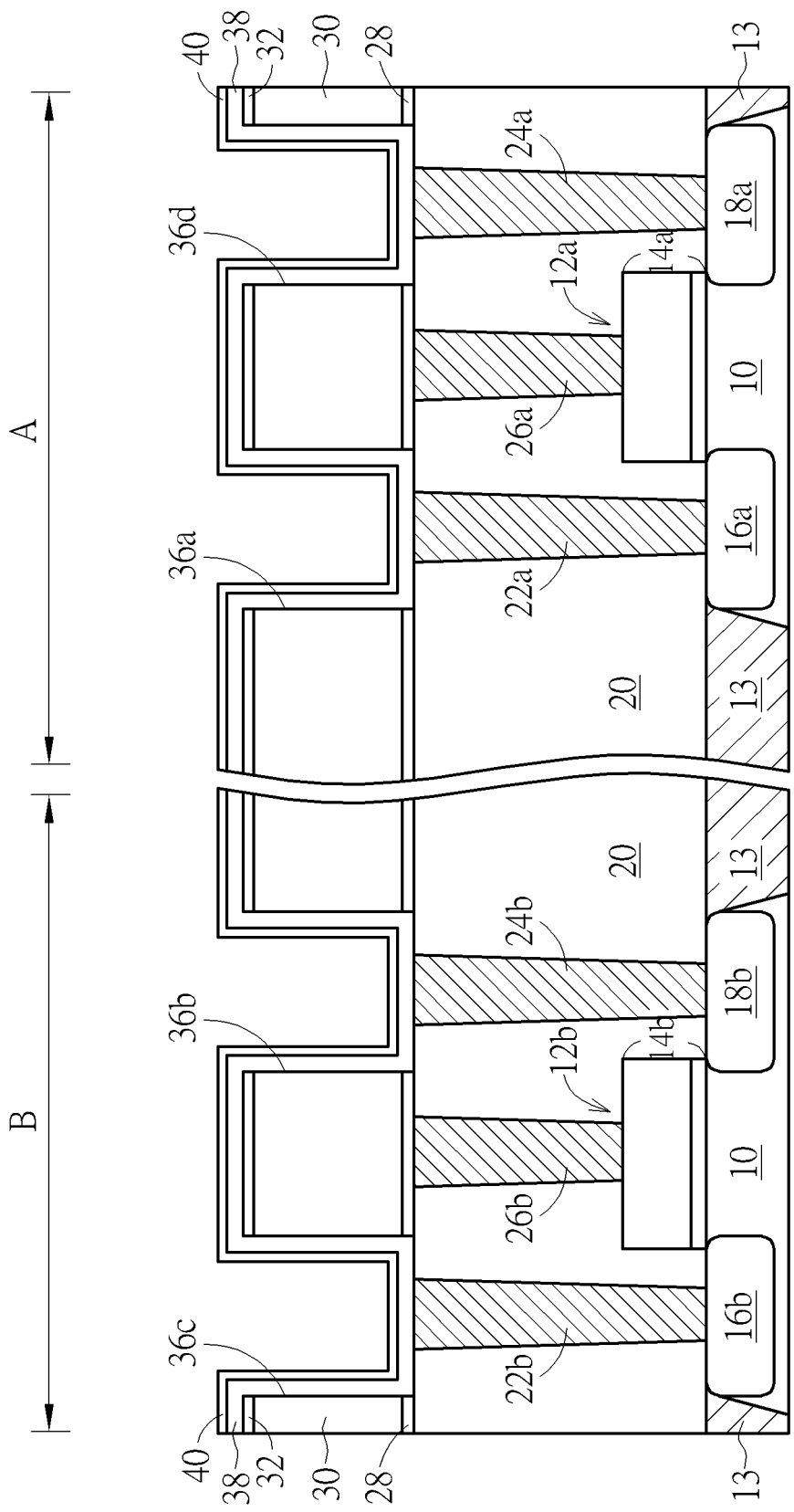
Figure 4:
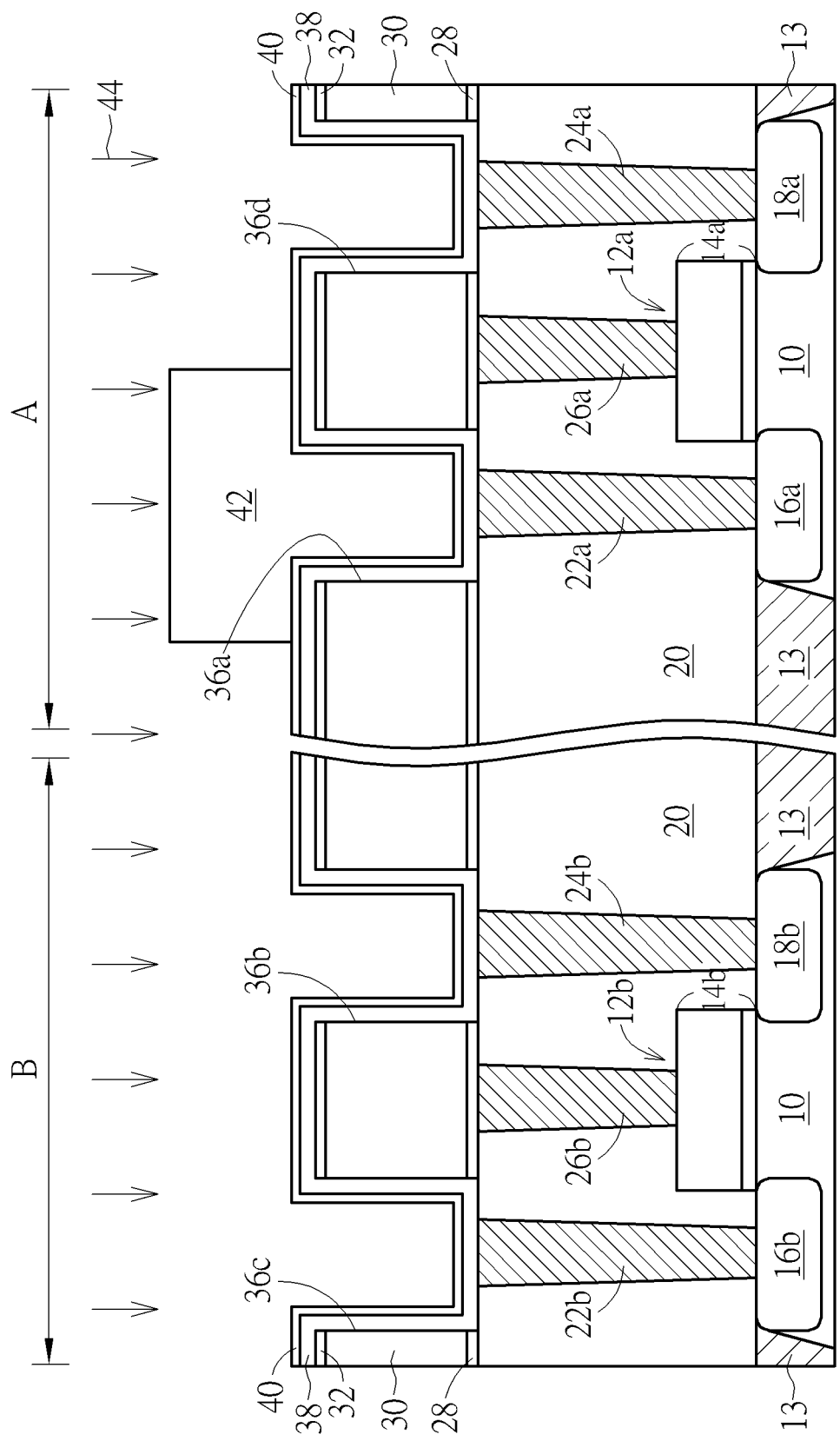
Figure 5:
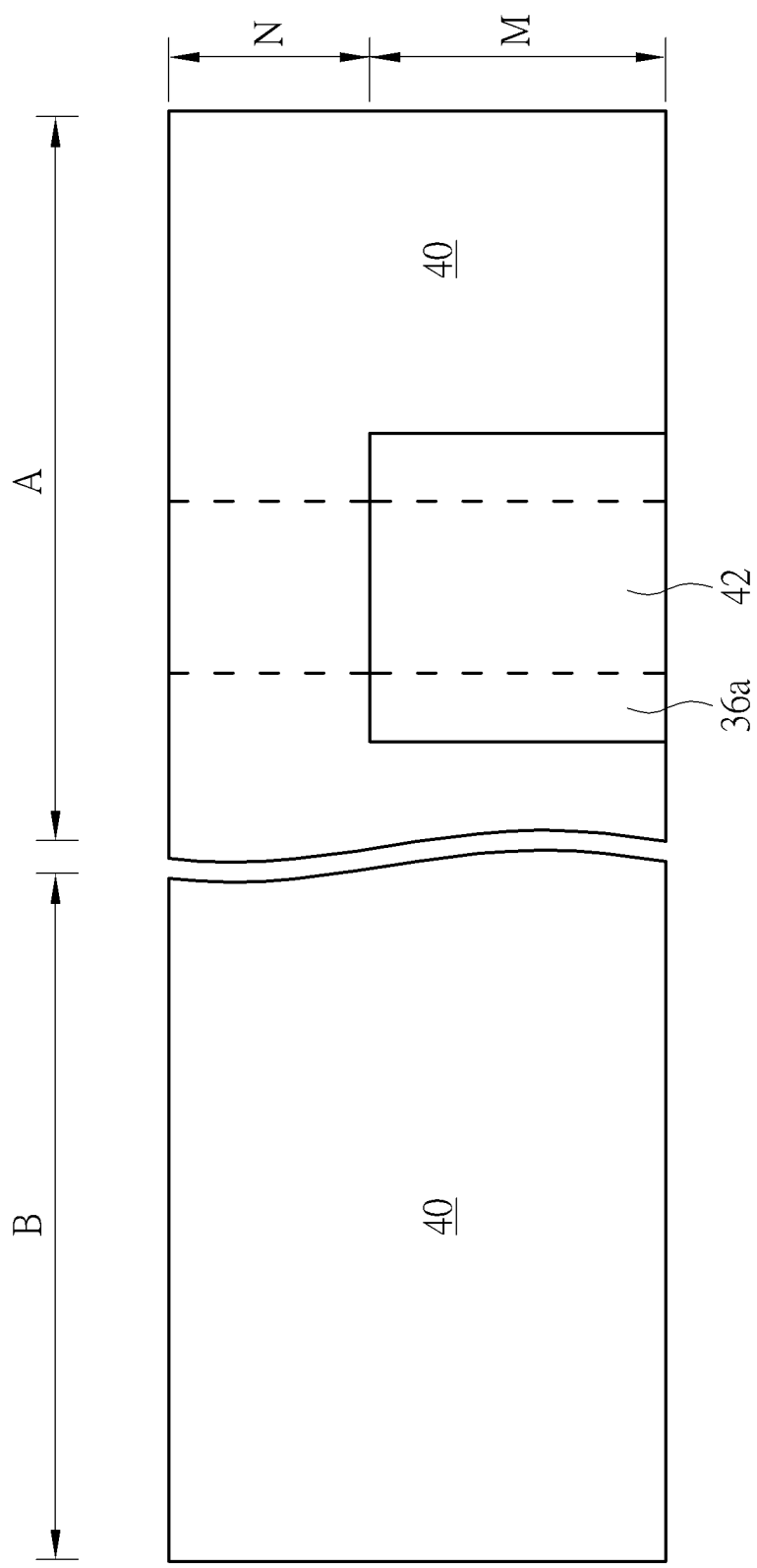
Figure 6:
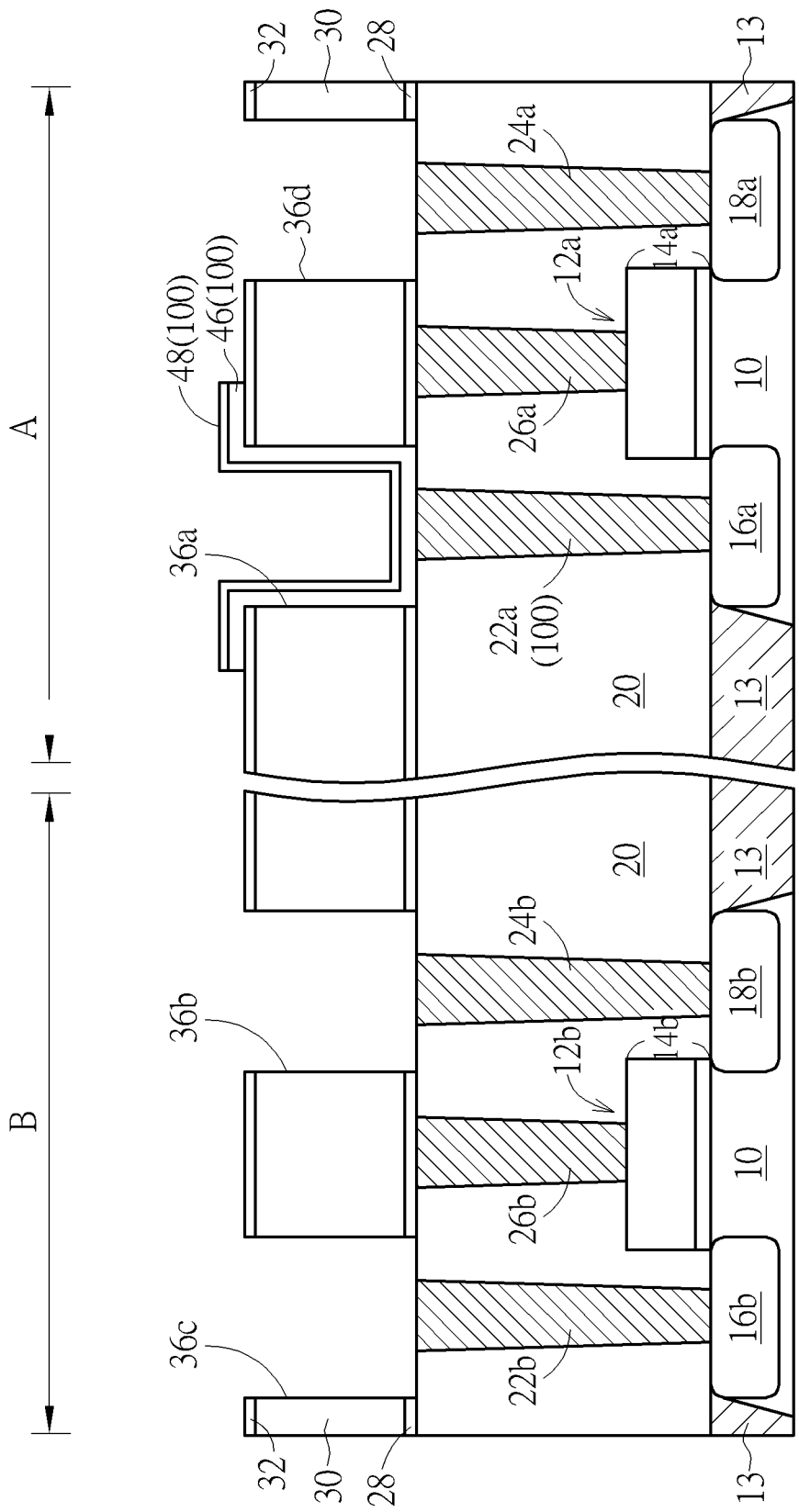
Figure 7:
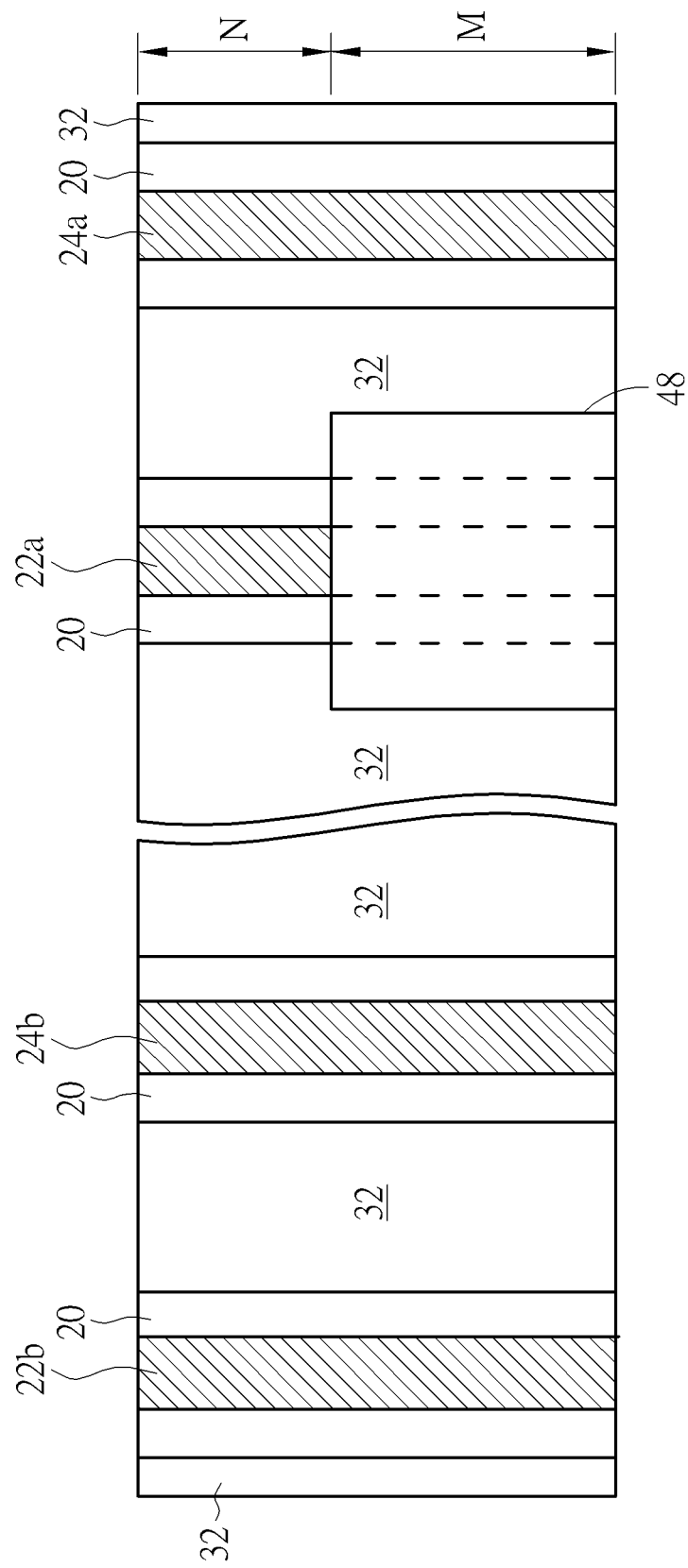

FIG. 1 to FIG. 9 depict a fabricating method of a resistive random access memory structure according to a preferred embodiment of the present invention, wherein FIG. 5 depicts a top view of FIG. 4, and FIG. 7 depicts a top view of FIG. 6.

Figure 1:
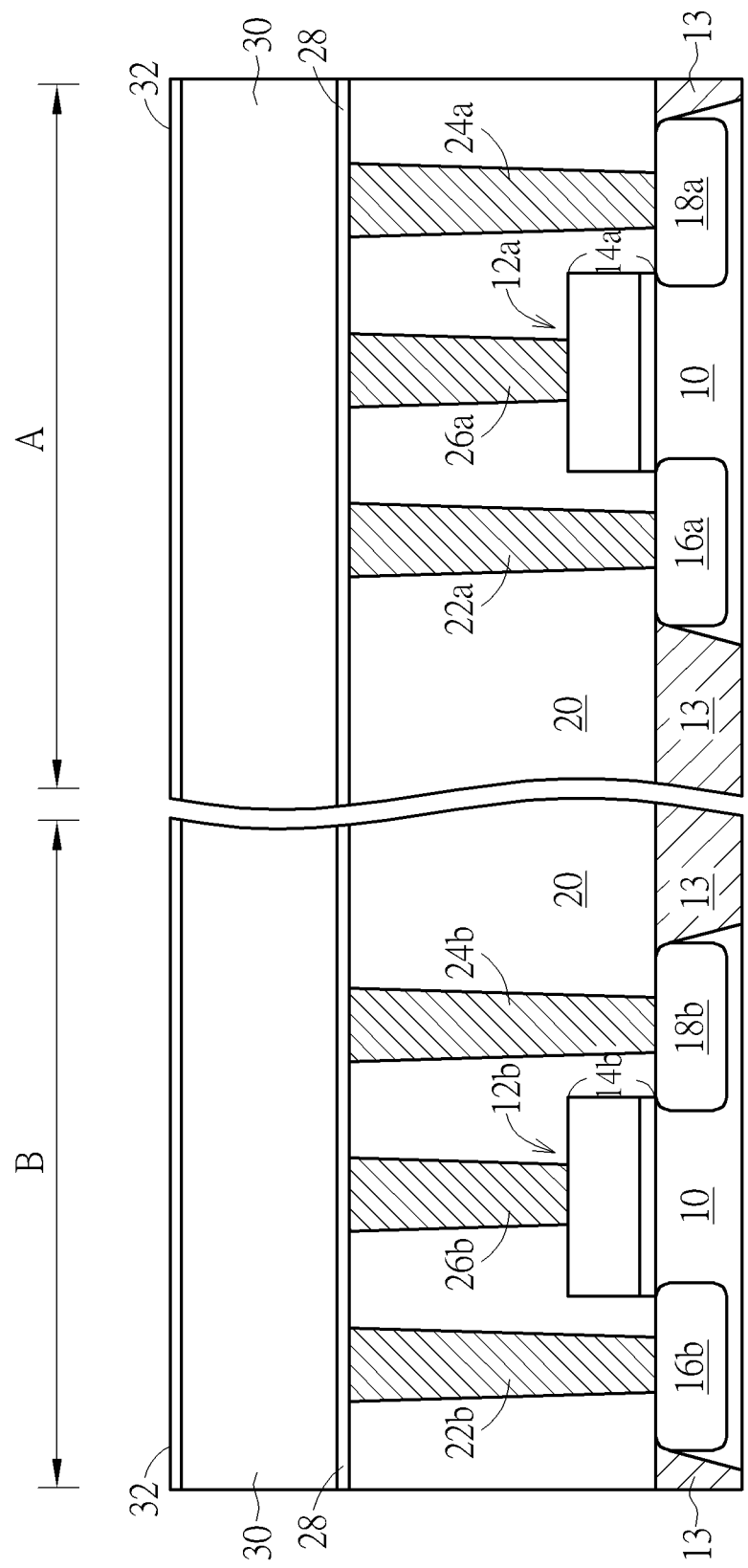

As shown in FIG. 1, a substrate 10 is provided. The substrate 10 is divided into a memory cell region A and a logic element region B. A first transistor 12a and a second transistor 12b are disposed on the substrate 10. The first transistor 12a is disposed within the memory cell region A, and the second transistor 12b is disposed within the logic element region B. The first transistor 12a includes a first gate structure 14a, a first source 18a and a first drain 16a. The second transistor 12b includes a second gate structure 14b, a second drain 18b and a second drain 16b. An interlayer dielectric layer 20 covers the substrate 10, the first transistor 12a and the second transistor 12b. A first drain contact plug 22a, a first source contact plug 24a, a second drain contact plug 22b and a source contact plug 24b penetrate the interlayer dielectric layer 20. Moreover, the first drain contact plug 22a contacts the first drain 16a. The first source contact plug 24a contacts the first source 18a. The second drain contact plug 22b contacts the second drain 16b. The second source contact plug 24b contacts the second source 18b. The first gate contact plug 26a penetrates the interlayer dielectric layer 20 to contact the first gate structure 14a. The second gate contact plug 26b penetrates the interlayer dielectric layer 20 to contact the second gate structure 14b. Next, an etching stop layer 28, a metal interlayer dielectric layer 30 and a hard mask 32 are formed in sequence to cover the interlayer dielectric layer 20. The etching stop layer 28 preferably includes silicon oxynitride, silicon carbide nitride or silicon nitride. The metal interlayer dielectric layer 30 can be oxide such as silicon oxide. The hard mask 32 can be titanium nitride or silicon nitride.

As shown in FIG. 2, the hard mask 32 is patterned by taking the etching stop layer 28 as a stop layer. Next, a first patterning process is performed by taking the hard mask 32 after patterning as a mask to etch the metal interlayer dielectric layer 30 and the etching stop layer 28 to form a first trench 36a, a second trench 36b, a third trench 36c and a fourth trench 36d. The first drain contact plug 22a is exposed through the first trench 36a. The first source contact plug 24a is exposed through the fourth trench 36d. The second source contact plug 24b is exposed through the second trench 36b. The second drain contact plug 22b is exposed through the third trench 36c. The first drain contact plug 22a, the first source contact plug 24a, the second drain contact plug 22b and the second source contact plug 24b are preferably tungsten, copper or other metals. In this embodiment, the first drain contact plug 22a, the first source contact plug 24a, the second drain contact plug 22b and the second source contact plug 24b are tungsten.

As shown in FIG. 3, a metal oxide material layer 38 and a top electrode material layer 40 are formed in sequence to conformally fill into the first trench 36a, the second trench 36b, the third trench 36c and the fourth trench 36d, and to cover the metal interlayer dielectric layer 30. The metal oxide material layer 38 includes tantalum oxide, hafnium oxide or titanium oxide. The top electrode material layer 40 includes titanium nitride or tantalum nitride. In this embodiment, the metal oxide material layer 38 is tantalum oxide. The top electrode material layer 40 is tantalum nitride. The metal oxide material layer 38 and the top electrode material layer 40 can be made by sputtering.

Please refer to FIG. 4 and FIG. 5. A photoresist 42 is formed to cover a memory cell predetermined region M within the first trench 36a, expose a metal connection region N within the first trench 36a and expose the entire logic element region B. Please refer to FIG. 4, FIG. 6 and FIG. 7, a second patterning process 44 is performed to pattern the metal oxide material layer 38 and the top electrode material layer 40 by taking the photoresist 42 as a mask to form a metal oxide layer 46 and a top electrode 48. The metal oxide layer 46 and the top electrode 48 are located within the memory cell predetermined region M. Now, the top electrode 48, the metal oxide layer 46 and the first drain contact plug 22a form a resistive random access memory (RRAM) 100. The first drain contact plug 22a serves as a bottom electrode of the RRAM 100. The second patterning process 44 is preferably an etching process. During the etching process of the second patterning process 44, the hard mask 32, the first drain contact plug 22a, the first source contact plug 24a, the second drain contact plug 22b and the second source contact plug 24b serve as a stop layer. After the second patterning process 44, the photoresist 42 is removed. While removing the photoresist 42, the top electrode 48 can protect the metal oxide layer 46 from being damaged by cleaning solution used for removing the photoresist 42.

Figure 8:
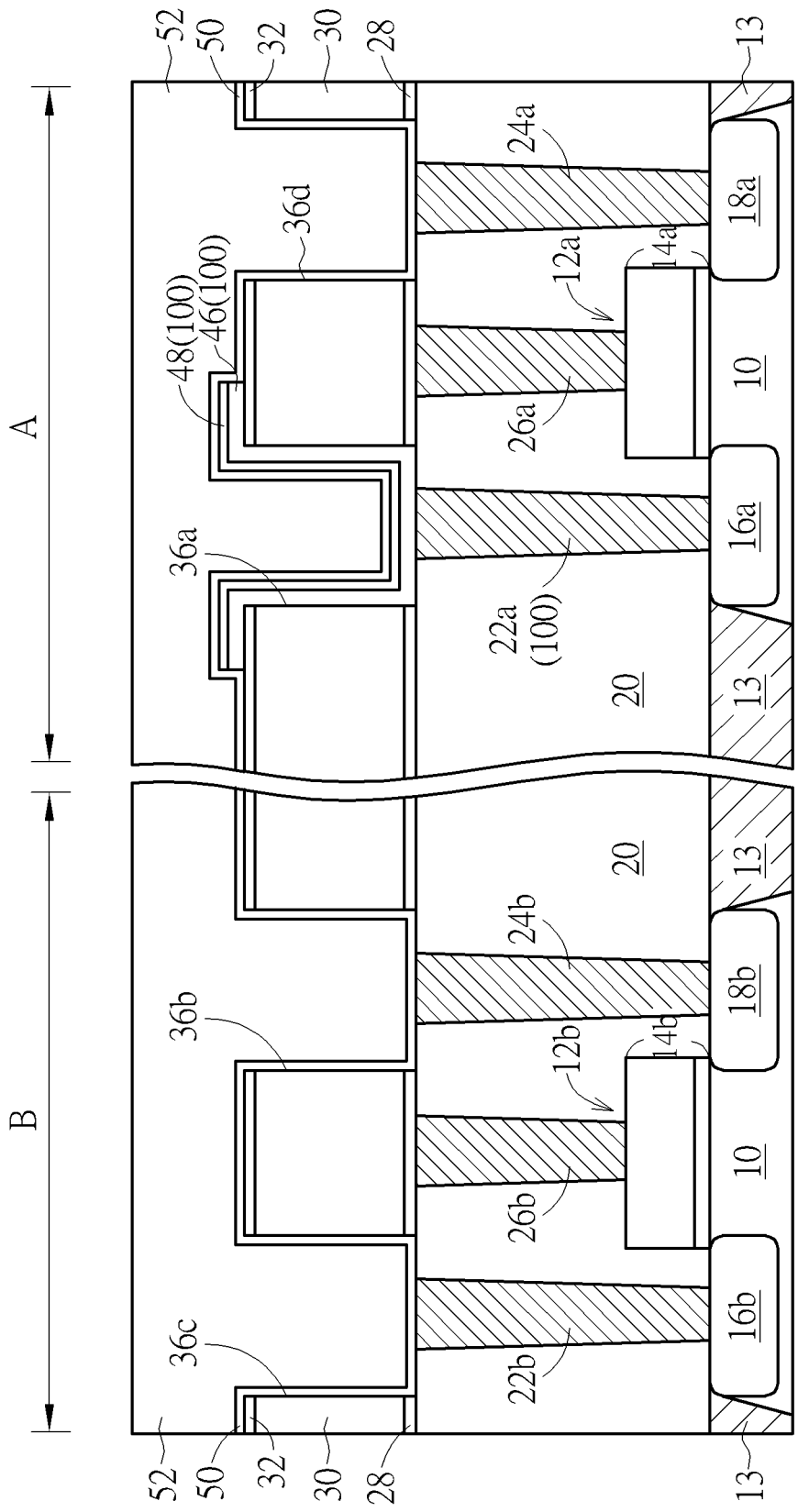
Figure 9:
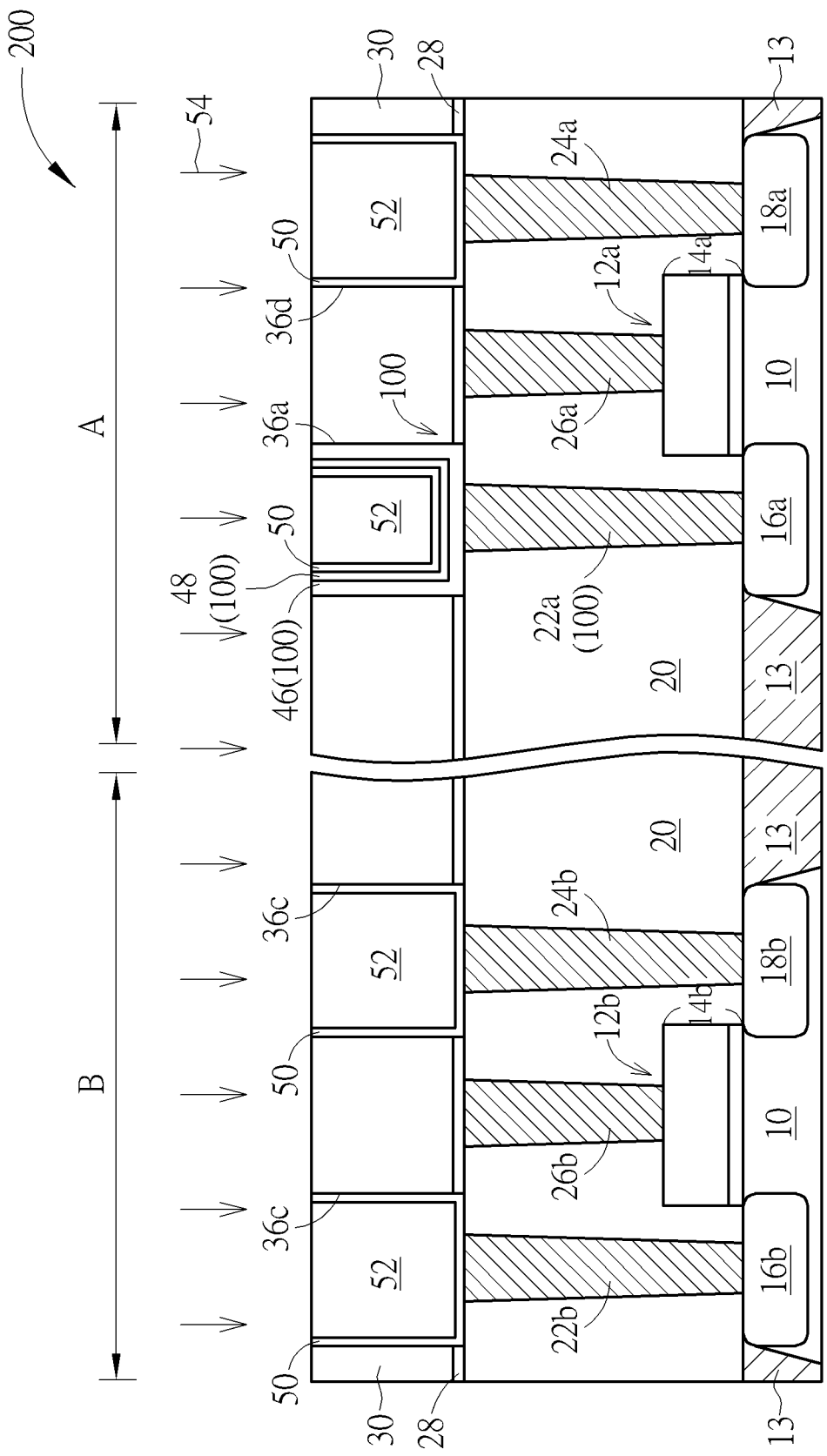

As shown in FIG. 8, a buffer layer 50 and a metal layer 52 are formed in sequence to fill in the first trench 36a, the second trench 36b, the third trench 36c and the fourth trench 36d, and cover the interlayer dielectric layer 20 and the RRAM 100. As shown in FIG. 9, a planarization process 54 is performed to remove the hard mask 32, the metal oxide layer 46, the top electrode 48, the buffer layer 50 and the metal layer 52 outside of the first trench 36a, and to remove the hard mask 32, the buffer layer 50 and the metal layer 52 outside of the second trench 36b, the third trench 36c and the fourth trench 36d. Now, the metal layer 52 within the first trench 36a serves as a bit line of the first transistor 12a. The metal layer 52 within the fourth trench 36d serves as a source line of the first transistor 12a. The metal layer 52 within the second trench 36b serves as a source line of the second transistor 12b. The metal layer 52 within the third trench 36c serves as a drain line of the second transistor 12b. Now, an RRAM structure 200 of the present invention is completed.

Figure 10:
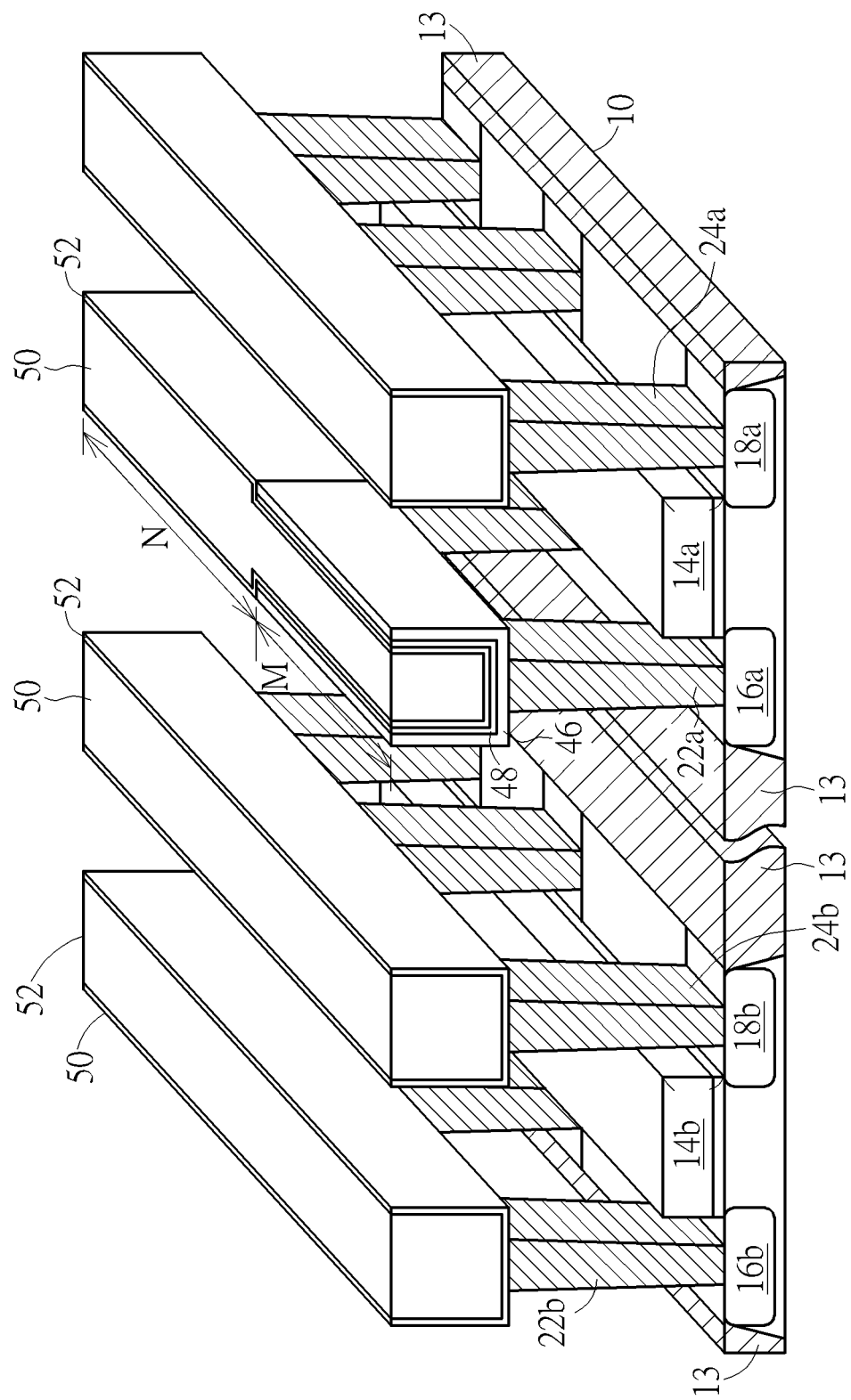
FIG. 10 shows a three-dimensional view of the RRAM structure in FIG. 9.

FIG. 9 depicts a RRAM structure according to a preferred embodiment of the present invention. FIG. 10 shows a three-dimensional view of the RRAM structure in FIG. 9. In order to show the RRAM structure clearly, the inlayer dielectric layer, the metal interlayer dielectric layer and all gate contact plugs are omitted in FIG. 10.

Please refer to FIG. 9 and FIG. 10. An RRAM structure 200 includes a substrate 10. The substrate 10 is divided into a memory cell region A and a logic element region B. A first transistor 12a and a second transistor 12b are disposed on the substrate 10. The first transistor 12a is disposed within the memory cell region A, and the second transistor 12b is disposed within the logic element region B. Numerous shallow trench isolations 13 are disposed within the substrate 10 and at two sides of the first transistor 12a and the second transistor 12b. The first transistor 12a includes a first gate structure 14a, a first source 18a and a first drain 16a. The second transistor 12b includes a second gate structure 14b, a second drain 18b and a second drain 16b. An interlayer dielectric layer 20 covers the substrate 10, the first transistor 12a and the second transistor 12b. A first drain contact plug 22a, a first source contact plug 24a, a second drain contact plug 22b and a source contact plug 24b penetrate the interlayer dielectric layer 20. Moreover, the first drain contact plug 22a contacts the first drain 16a. The first source contact plug 24a contacts the first source 18a. The second drain contact plug 22b contacts the second drain 16b. The second source contact plug 24b contacts the second source 18b. The first gate contact plug 26a penetrates the interlayer dielectric layer 20 to contact the first gate structure 14a. The second gate contact plug 26b penetrates the interlayer dielectric layer 20 to contact the second gate structure 14b.

A metal interlayer dielectric layer 30 is disposed on the first drain contact plug 22a and covers the interlayer dielectric layer 20. An RRAM 100 is disposed on the first drain 16a and within a first trench 36a within the metal interlayer dielectric layer 30. The RRAM 100 includes the first drain contact plug 22a, the metal oxide layer 46 and the top electrode 48. The first drain contact plug 22a serves as a bottom electrode of the RRAM 100. The metal oxide layer 46 contacts the drain contact plug 22a and the top electrode 48 contacts the metal oxide layer 46. Furthermore, a buffer layer 50 and a metal layer 52 are disposed within the first trench 36a. The buffer layer 50 is disposed between the metal layer 52 and top electrode 48. The metal layer 52 and the buffer layer 50 are disposed within a fourth trench 36d within the metal interlayer dielectric layer 30. The buffer layer 50 within the fourth trench 36d contacts the first source contact plug 24a. The metal layer 52 within the first trench 36a serves as a bit line of the first transistor 12a. The metal layer 52 within the fourth trench 36d serves as a source line of the first transistor 12a.

Moreover, the first trench 36a is divided into a memory cell predetermined region M and a metal connection region N. The RRAM 100 is disposed within the memory cell predetermined region M. In other words, the metal oxide layer 46 and the top electrode 48 are within the memory cell predetermined region M. However, the metal oxide layer 46 and the top electrode 48 are not within the metal connection region N, and the metal layer 52 and the buffer layer 50 are within the metal connection region N.

Moreover, a second trench 36b and a third trench 36c are disposed within the logic element region B. The metal layer 52 and the buffer layer 50 are also disposed within the second trench 36b and the third trench 36c. A top surface of the metal layer 52 within the first trench 36a, the second trench 36b, the third trench 36c and the fourth trench 36d is aligned with a top surface of the metal interlayer dielectric layer 30. Moreover, the metal oxide layer 46 forms a U-shaped profile. The U-shaped profile includes two ends. The two ends are also aligned with the top surface of the metal interlayer dielectric layer 30. The top surface of the buffer layer 48 and the top surface of the top electrode 50 are also aligned with the top surface of the metal interlayer dielectric layer 30. According to a preferred embodiment of the present invention, the first drain contact plug 22a, the first source contact plug 24a, the second drain contact plug 22b and the second source contact plug 24b are preferably tungsten. The metal oxide layer 46 is tantalum oxide. The top electrode 48 is tantalum nitride. However, the top electrode 48 can be made of other conductive materials such as hafnium, zirconium, aluminum, tantalum, titanium, chromium, tungsten, copper, cobalt, palladium or platinum. The metal oxide layer 46 can be hafnium oxide, aluminum oxide, lanthanum oxide, yttrium oxide or zirconium oxide.

The RRAM of the present invention is arranged at the position of the first metal layer (metal one level) in the local interconnection of the back-end process. In details, the first metal layer directly contacts the source contact plug and the drain contact plug. Therefore, the fabricating process of the RRAM can be combined with the first metal layer process. The first metal layer process refers to a process of forming the metal layer in the second trench, the third trench and the fourth trench as described above. Combining with the first metal layer process, the metal oxide layer and the top electrode of the RRAM, and the metal layer in the first trench can be planarized by the planarization process in the first metal layer process. In this way, an additional planarization process is not required.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive random access memory structure, comprising:
a substrate;
a transistor disposed on the substrate, wherein the transistor comprises a gate structure, a source and a drain;
a drain contact plug contacting the drain;
a metal interlayer dielectric layer disposed on the drain contact plug;
a resistive random access memory (RRAM) disposed on the drain and within a first trench in the metal interlayer dielectric layer, wherein the RRAM comprises the drain contact plug, a metal oxide layer and a top electrode, the drain contact plug serves as a bottom electrode of the RRAM, the metal oxide layer contacts the drain contact plug and the top electrode contacts the metal oxide layer; and
a metal layer disposed within the first trench.

2. The resistive random access memory structure of claim 1, wherein a top surface of the metal layer is aligned with a top surface of the metal interlayer dielectric layer.

3. The resistive random access memory structure of claim 1, wherein the metal oxide layer forms a U-shaped profile.

4. The resistive random access memory structure of claim 1, wherein the first trench is separated into a memory cell predetermined region and a metal connection region, the metal oxide layer and the top electrode are disposed within the memory cell predetermined region.

5. The resistive random access memory structure of claim 4, wherein the metal oxide layer is not within the metal connection region and the top electrode is not within the metal connection region.

6. The resistive random access memory structure of claim 1, further comprising a second trench disposed within the metal interlayer dielectric layer, a source contact plug contacting the source and being exposed from the second trench, a buffer layer and the metal layer disposed within the second trench, and the buffer layer contacting the source contact plug.

7. The resistive random access memory structure of claim 1, wherein the metal oxide layer and the top electrode are not within the second trench.

8. A fabricating method of a resistive random access memory structure, comprising:
providing a substrate, wherein a first transistor is disposed on the substrate, the first transistor comprises a first gate structure, a first source and a first drain, a first drain contact plug contacts the first drain, and an interlayer dielectric layer covers the substrate and the first transistor;
forming a metal interlayer dielectric layer covering the interlayer dielectric layer;
performing a first patterning process to etch the metal interlayer dielectric layer to form a first trench, and wherein the first drain contact plug is exposed through the first trench;
forming a metal oxide material layer and a top electrode material layer in sequence to fill in the first trench and cover the metal interlayer dielectric layer;
performing a second patterning process to pattern the metal oxide material layer and the top electrode material layer to form a metal oxide layer and a top electrode, wherein the top electrode, the metal oxide layer and the first drain contact plug form a resistive random access memory (RRAM);
forming a metal layer filling in the first trench and covering the metal interlayer dielectric layer and the RRAM; and
performing a planarization process to remove the metal oxide layer, the top electrode and the metal layer outside of the first trench.

9. The fabricating method of a resistive random access memory structure of claim 8, further comprising:
providing a second transistor disposed on the substrate, wherein the second transistor comprises a second gate structure, a second source and a second drain, the interlayer dielectric layer covers the second transistor, a second source contact plug and a second drain contact plug are disposed within the interlayer dielectric layer and respectively contact the second source and the second drain.

10. The fabricating method of a resistive random access memory structure of claim 9, further comprising:
during the first patterning process, etching the metal interlayer dielectric layer to form a second trench and a third trench, wherein the second source contact plug is exposed through the second trench and the second drain contact plug is exposed through the third trench;

while forming the metal oxide material layer and the top electrode material layer to fill in the first trench, the metal oxide material layer and the top electrode material layer filling in the second trench and the third trench and the metal oxide material layer and the top electrode material layer covering the metal interlayer dielectric layer;

after the second patterning process, forming a buffer layer filling in the first trench, the second trench and the third trench;

while forming the metal layer to fill in the first trench, the metal layer filling in the second trench and the third trench; and during the planarization process, removing the metal oxide layer, the top electrode layer, the buffer layer and the metal layer outside of the first trench, and removing the buffer layer outside of the second trench and the third trench, and the metal layer outside of the third trench.

11. The fabricating method of a resistive random access memory structure of claim 10, wherein a top surface of the metal layer, a top surface of the buffer layer, a top surface of the metal oxide layer, a top surface of the top electrode and a top surface of the metal interlayer dielectric layer are aligned.

12. The fabricating method of a resistive random access memory structure of claim 10, wherein the first trench is separated into a memory cell predetermined region and a metal connection region, during the second patterning process, removing the metal oxide layer and the top electrode within the metal connection region, and remaining the metal oxide layer and the top electrode within the memory cell predetermined region.

\* \* \* \* \*